(12) United States Patent
Takizawa

(10) Patent No.: US 9,350,266 B2
(45) Date of Patent: May 24, 2016

(54) POWER SUPPLY CIRCUIT FOR GATE DRIVING CIRCUIT OF A POWER CONVERTER

(71) Applicant: FUJI ELECTRIC CO., LTD., Kawasaki-shi (JP)

(72) Inventor: Satoki Takizawa, Hino (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 9 days.

(21) Appl. No.: 14/276,354

(22) Filed: May 13, 2014

(65) Prior Publication Data

US 2014/0347905 A1    Nov. 27, 2014

(30) Foreign Application Priority Data

May 21, 2013 (JP) ................................. 2013-107081

(51) Int. Cl.
| | |
|---|---|
| H02M 7/5387 | (2007.01) |
| H02M 7/537 | (2006.01) |
| H02M 1/088 | (2006.01) |
| H02M 7/487 | (2007.01) |

(52) U.S. Cl.
CPC .............. *H02M 7/537* (2013.01); *H02M 1/088* (2013.01); *H02M 7/487* (2013.01); *H03K 2217/0081* (2013.01)

(58) Field of Classification Search
CPC ..... H02M 7/537; H02M 7/487; H02M 1/088; H02K 2217/0081; H03K 2217/0081
USPC ................................................. 363/131, 132
See application file for complete search history.

(56) References Cited

U.S. PATENT DOCUMENTS

| | | | | |
|---|---|---|---|---|
| 5,233,286 | A * | 8/1993 | Rozman | H02J 4/00 322/90 |
| 7,518,891 | B2 * | 4/2009 | Wei | H02M 1/126 363/123 |
| 8,363,441 | B2 | 1/2013 | Ohashi et al. | |
| 2008/0253156 | A1 * | 10/2008 | Urakabe | H02M 3/158 363/65 |
| 2008/0315859 | A1 * | 12/2008 | Ponnaluri et al. | 323/351 |
| 2009/0195068 | A1 * | 8/2009 | Ohashi et al. | 307/18 |
| 2014/0268929 | A1 * | 9/2014 | Biebach | H02M 7/797 363/37 |

FOREIGN PATENT DOCUMENTS

| | | | |
|---|---|---|---|
| JP | 2003-168598 | A | 6/2003 |
| JP | 2006-081232 | A | 3/2006 |
| JP | 2008-228440 | A | 9/2008 |
| JP | 2009-177951 | A | 8/2009 |

\* cited by examiner

*Primary Examiner* — Jessica Han
*Assistant Examiner* — Lorena Bruner
(74) *Attorney, Agent, or Firm* — Rabin & Berdo, P.C.

(57) ABSTRACT

A power supply circuit for a gate driving circuit for driving semiconductor switching devices of a power converter that is configured to perform a DC to AC conversion. The power supply circuit includes a DC power supply including a plurality of serially-connected single DC power supplies, a flying capacitor type power conversion circuit including a plurality of flying capacitors connected in parallel to a plurality of the semiconductor switching devices, and a plurality of serially-connected circuits each having an insulating device, a middle part of the series-connected circuits being connected to a middle potential point of the flying capacitors, and to a fixed potential point of the DC power supply.

8 Claims, 10 Drawing Sheets

| gate driving circuit | operating potential of the gate driving circuit | maximum applied voltage between primary and secondary windings of Tr2 | middle point potential between Tr2 and Tr3 | maximum applied voltage between primary and secondary windings of Tr3 |
|---|---|---|---|---|
| for Su1 | 2Ed ~ 0 | Ed | E1 (Ed) | Ed |
| for Su2 | 2Ed ~ −2Ed | Ed | E3 | Ed |
| for Sx1 | 0 ~ −2Ed | Ed | E2 (−Ed) | Ed |
| for Sx2 | −2Ed | Ed | E2 (−Ed) | Ed |

Fig.5

| gate driving circuit | operating potential of the gate driving circuit | maximum applied voltage between primary and secondary windings of Tr2 | middle point potential between Tr2 and Tr3 | maximum applied voltage between primary and secondary windings of Tr3 |
|---|---|---|---|---|
| for S1a | 2Ed ~ Ed | Ed | E1 (Ed) | Ed |
| for S1b | 2Ed ~ 0 | Ed | E1 (Ed) | Ed |
| for S1c | 2Ed ~ -Ed | 1.5Ed | E3 | 0.5Ed |
| for S2 | 2Ed ~ -2Ed | 1.5Ed | E3 | 0.5Ed |
| for S3 | Ed ~ -2Ed | 1.5Ed | E3 | 0.5Ed |
| for S4a | 0 ~ -2Ed | Ed | E2 (-Ed) | Ed |
| for S4b | -Ed ~ -2Ed | Ed | E2 (-Ed) | Ed |
| for S4c | -2Ed | Ed | E2 (-Ed) | Ed |
| for S5 | Ed ~ -Ed | Ed | — | — |
| for S6 | Ed ~ -2Ed | 1.5Ed | E3 | 0.5Ed |
| for S7 | 0 | — | — | — |
| for S8 | Ed ~ -Ed | Ed | — | — |

| gate driving circuit | operating potential of the gate driving circuit | maximum applied voltage between primary and secondary windings of Tr2 | middle point potential between Tr2 and Tr3 | maximum applied voltage between primary and secondary windings of Tr3 |
|---|---|---|---|---|
| for S1a | $3Ed \sim 2Ed$ | $Ed$ | $E1\ (Ed)$ | $2Ed$ |
| for S1b | $3Ed \sim Ed$ | $Ed$ | $E1\ (Ed)$ | $2Ed$ |
| for S1c | $3Ed \sim 0$ | $Ed$ | $E1\ (Ed)$ | $2Ed$ |
| for S1d | $3Ed \sim -Ed$ | $Ed$ | $E1\ (Ed)$ | $2Ed$ |
| for S2 | $3Ed \sim -2Ed$ | $2Ed$ | $E3$ | $Ed$ |
| for S3 | $3Ed \sim -3Ed$ | $2Ed$ | $E3$ | $Ed$ |
| for S4 | $2Ed \sim -3Ed$ | $2Ed$ | $E3$ | $Ed$ |
| for S5 | $Ed \sim -3Ed$ | $Ed$ | $E2\ (-Ed)$ | $2Ed$ |
| for S6a | $0 \sim -3Ed$ | $Ed$ | $E2\ (-Ed)$ | $2Ed$ |
| for S6b | $-Ed \sim -3Ed$ | $Ed$ | $E2\ (-Ed)$ | $2Ed$ |
| for S6c | $-2Ed \sim -3Ed$ | $Ed$ | $E2\ (-Ed)$ | $2Ed$ |
| for S6d | $-3Ed$ | $Ed$ | $E2\ (-Ed)$ | $2Ed$ |
| for S7 | $2Ed \sim 0$ | $2Ed$ | — | — |
| for S8 | $Ed \sim -Ed$ | $Ed$ | — | — |
| for S9 | $0 \sim -2Ed$ | $2Ed$ | — | — |
| for S10 | $Ed \sim -3Ed$ | $Ed$ | $E2\ (-Ed)$ | $2Ed$ |
| for S11 | $0$ | — | — | — |
| for S12 | $Ed \sim -Ed$ | $Ed$ | — | — |

Fig.7

(a) High frequency insulation system (b) Commercial frequency insulation system

POWER SUPPLY CIRCUIT FOR GATE DRIVING CIRCUIT OF A POWER CONVERTER

CROSS-REFERENCE TO RELATED APPLICATION

This application is based on, and claims priority to, Japanese Patent Application No. 2013-107081, filed on May 21, 2013, contents of which are incorporated herein by reference.

BACKGROUND OF THE INVENTION

1. Field of the Invention

The present invention relates to a power supply circuit for a gate driving circuit for driving power semiconductor switching devices of a power converter such as an inverter, in particular to such a circuit in a power conversion circuit that uses flying capacitors.

2. Description of the Related Art

FIG. 8 is a circuit diagram of the main circuit of a two-level inverter circuit, a representative power conversion circuit, performing DC to AC power conversion. The inverter circuit of FIG. 8 includes a main AC power source APM, a rectifying circuit RE composed of diodes and other circuit elements for converting an AC power to a DC power, and a DC intermediate circuit corresponding to a DC power supply generally composed of large capacity capacitors Ca and Cb. When a rectified DC voltage is higher than the rated voltage of the capacitor, the two capacitors are connected in series as shown in FIG. 8. The inverter system of FIG. 8 includes a load such as an AC motor ACM and a DC to AC conversion circuit INV having power semiconductor devices, the conversion circuit INV delivering variable voltages at variable frequencies. When power is regenerated from the load, the inverter main circuit operates as a converter to convert the AC power to DC power.

The DC to AC conversion circuit INV includes semiconductor switching devices Su, Sv, Sw, Sx, Sy, and Sz each having an IGBT (insulated-gate bipolar transistor) and an antiparallel-connected diode. A three-phase-output circuit includes six circuits of the semiconductor switching devices. The power converter further includes gate driving circuits GDu, GDv, GDw, GDx, GDy, and GDz for driving the IGBTs, and a control circuit CNT for controlling the power converter circuit. The control circuit CNT gives an ON-OFF command signal, a gate driving signal, to a gate driving circuit for each IGBT. Because the base potential of the control circuit generally differs from the potential at the IGBTs and potential at their gate driving circuit, power supply to the gate driving circuit needs an insulating device such as a transformer.

FIGS. 9A and 9B show examples of circuits for supplying power to a gate driving circuit GD from a low voltage AC power supply AP at a commercial frequency. The low voltage AC power of the power supply AP is usually supplied by the main AC power source APM indicated in FIG. 8. The system of FIG. 9A generates high frequency AC from the low voltage AC power supply AP through an AC/AC conversion circuit ACV or an AC/DC/AC conversion circuit, insulates the high frequency AC through an insulating device of a high frequency transformer HFT, converts the insulated high frequency AC into DC power with a diode D and a capacitor Cd, and supplies the DC power to a gate driving circuit GD for an IGBT S. Here, the high frequency AC helps to miniaturize the transformer HFT. FIG. 9B shows a system using an insulating device of a commercial frequency insulating transformer CFT. This system eliminates the AC/AC conversion circuit ACV in the system of FIG. 9A and establishes electrical insulation maintaining at the commercial frequency. In this construction, however, the insulating transformer CFT operates at a commercial frequency, and thus has a larger size than the transformer HFT in the system of FIG. 9A.

For the high frequency transformer HFT and the commercial frequency transformer CFT for use in the apparatus for driving motors of 200 V system and 400 V system, a withstand voltage around 2 kV is sufficient. However, for a power supply to a gate driving circuit for IGBTs used in a high voltage apparatus of several kilo-volts, a transformer with a withstand voltage over 10 kV is needed.

FIG. 10 shows a high voltage power conversion circuit based on the circuit of FIG. 8. This circuit example, disclosed in Japanese Unexamined Patent Application Publication No. 2009-177951, is a flying capacitor type power conversion circuit. This circuit does not use a high withstand voltage semiconductor switching device, but uses low withstand voltage semiconductor switching devices connected in series. The circuit further includes a flying capacitor connected in parallel to the series circuit of semiconductor switching devices. Although FIG. 10 shows a circuit for three-phase AC output, only the U-phase is described below, because the three phases have the same circuit construction. The U-phase includes a series circuit of four semiconductor switching devices Su1, Su2, Sx1, and Sx2 between a positive terminal P and a negative terminal N of a DC power supply consisting of DC single power supplies DP1, DP2, DN1 and DN2 connected in series. A series circuit of flying capacitors Cu1 and Cu2 is connected between the connection point between the switching devices Su1 and Su2 and the connection point between the semiconductor switching devices Sx1 and Sx2. In the case that the voltage of the DC power supply is 4Ed and the potential at the point M, which is a middle potential point of the DC power supply, is defined to be the base potential zero, three levels of potentials 2Ed, 0, and −2sEd can be delivered at an AC output point A by controlling the flying capacitor voltage to be 2×Ed. Thus, the circuit of FIG. 10 is a three-level inverter.

FIGS. 11 and 12 show constructions of gate driving power supplies, wherein the circuit of FIG. 11 includes one transformer for each IGBT whereas the circuit of FIG. 12, which is disclosed in Japanese Unexamined Patent Application Publication No. 2006-081232, includes two series-connected transformers for each IGBT. The high frequency transformer HFT1 shown in FIG. 11 is provided for the purpose of electrical insulation between the low voltage AC power supply AP and the main circuit, and the high frequency transformer HFT3 shown in FIG. 12 is provided for the purpose of electrical insulation between the low voltage AC power supply AP and the potential at the point M of the DC power supply. Both the transformers HFT1 and HFT3 need usually to have high withstand voltage. The transformers HFT2 shown in FIG. 12 for supplying power to gate driving circuits for IGBTs operates with reference to the base potential at the point M and need a withstand voltage of 2×Ed.

High voltage apparatuses of several kilovolts as described above generally use high withstand voltage transformers to electrically insulate the power supplies for gate driving circuits for every IGBT. This causes a high cost. Transformers insuring a high withstand voltage must be ensured a sufficiently large insulation distance between the primary side and the secondary side, which causes the transformers to be large-sized. The cost and volume of the transformer are not simply proportional to the magnitude of the withstand voltage but increase in an exponential manner. Thus, the reduction of cost and volume is a severe challenge in high voltage apparatuses.

The three-level inverter shown in FIG. 11 and higher levels of multilevel inverters generally contain a large number of semiconductor switching devices, which in turn requires correspondingly many transformers of high withstand voltage, thereby causing a rise of cost. In the circuit having the structure of FIG. 12, the primary winding potential of the high frequency transformers HFT2 is the potential at the point M, but the transformers HFT2 need to insure a withstand voltage of at least 2 Ed, which is a half of the main circuit DC power supply voltage.

SUMMARY OF THE INVENTION

It is therefore an object of the present invention to provide a power supply circuit for gate driving circuit for semiconductor switching devices of a flying capacitor type power conversion circuit, the power supply circuit using an electrical insulation device with a low withstand voltage and thus achieving a reduced size and cost.

In order to achieve the above object, a first aspect of the present invention is a power supply circuit for gate driving circuit for semiconductor switching devices of a power converter having a DC power supply composed of a plurality of DC single power supplies connected in series with three terminals, a plurality of the semiconductor switching devices, and a flying capacitor(s), the power converter performing power conversion from DC to AC or from AC to DC, being composed of a flying capacitor type power conversion circuit, and generating multi-levels of voltage by adding or subtracting each voltage between terminals of the DC power supply and a voltage of the flying capacitor, the power supply circuit being composed of series-connected two or more circuits each using an insulating device, and a middle part of the series-connected circuits being connected to a middle potential point of the flying capacitors, or a fixed potential point(s) of a main circuit DC part.

A second aspect of the present invention is the power supply circuit for gate driving circuit of a power converter of the first aspect of the invention, wherein the fixed potential point(s) of the main circuit DC part is a potential point between the highest potential point and the middle potential point of the main circuit DC part, or a potential point between the lowest potential point and the middle potential point of the main circuit DC part.

A third aspect of the present invention is the power supply circuit for gate driving circuit of a power converter of the first aspect or the second aspect of the invention, wherein, the power supply circuit for a gate driving circuit includes at least two circuits each using the insulating device for power supply for the gate driving circuit connected in series from a reference potential point that is the middle potential point of the main circuit DC part.

In the present invention, an electric insulation method in a power supply circuit for gate driving circuit in a high voltage power converter of a several kilo volt class does not use an electric insulation device of one high withstand voltage transformer, but use a series-connected circuits of low withstand voltage transformers, which are small-sized and low cost.

The present invention uses an electric insulation device in a power supply circuit for gate driving circuit for semiconductor switching devices of a flying capacitor type power conversion circuit that is a type of high voltage power conversion system. An electric insulation device in the invention is not constructed using one high withstand voltage transformer, but constructed using a series circuit of low withstand voltage transformers, which are small sized and at a low cost. The middle connection point of the series connected circuit is connected to a middle potential point of the flying capacitor or to a fixed potential point of a main circuit DC part. This construction has achieved a power supply circuit for gate driving circuit that are small-sized and low cost.

BRIEF DESCRIPTION OF DRAWINGS

FIG. 5 is a table showing voltages at some points in the circuit of the Embodiment Example 2;

FIG. 7 is a table showing voltages at some points in the circuit of the Embodiment Example 3;

FIGS. 9A and 9B are circuit diagrams of conventional power supply circuit for gate driving circuit, wherein FIG. 9A shows a high frequency insulation system and FIG. 9B shows a commercial frequency insulation system;

DETAILED DESCRIPTION OF THE INVENTION

A power supply circuit for a gate driving circuit for semiconductor switching devices of a flying capacitor type power conversion circuit of the present invention uses an electric insulation device that is series-connected circuits each using a transformer in which a middle connection point of the series-connected circuits is connected to a middle potential point of the flying capacitors or a fixed potential point of a DC part of the main circuit.

Embodiment Example 1

Figure 1:
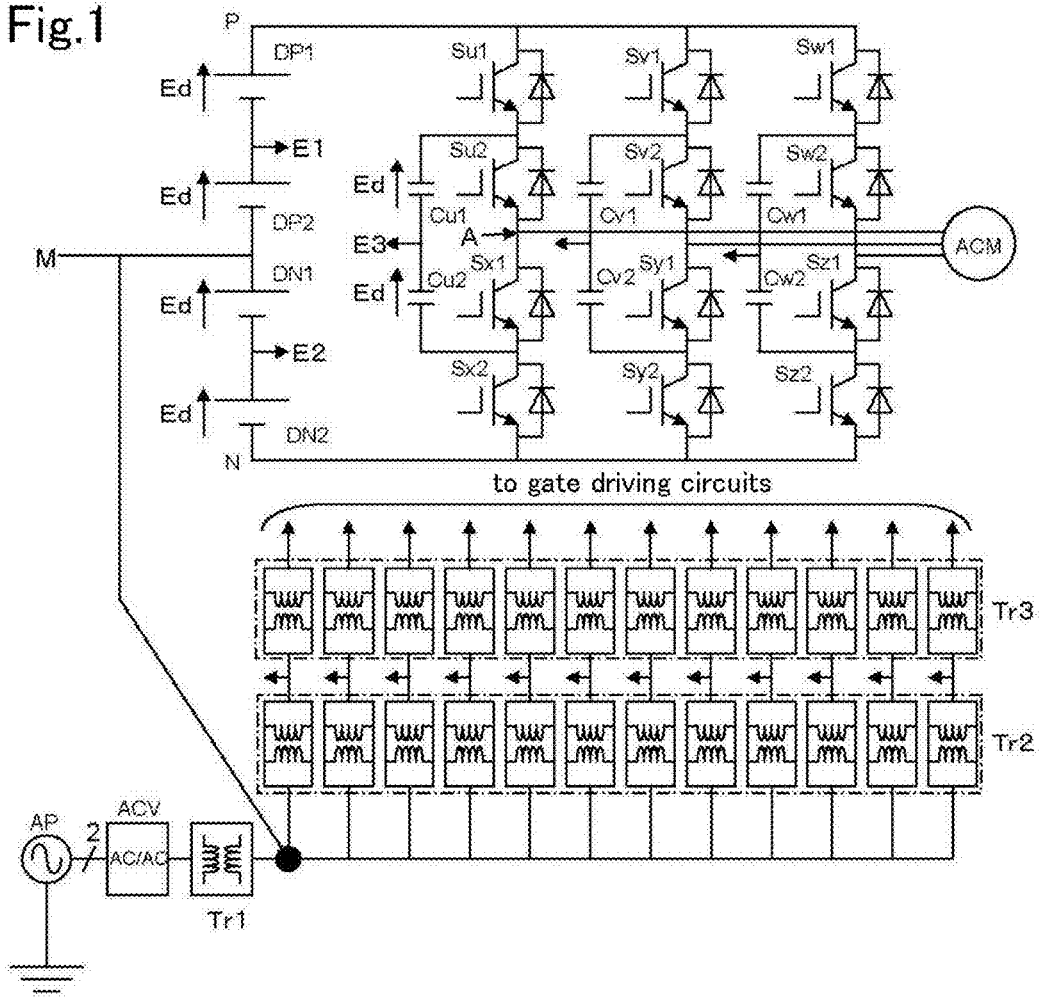
FIG. 1 is a circuit diagram showing an Embodiment Example 1 of the present invention.

FIG. 1 shows Embodiment Example 1, which is an embodiment in a three-level three-phase output inverter circuit using a flying capacitor. A gate driving circuit is connected to the gate of each IGBT, which is a semiconductor switching device, although FIG. 1 omits the gate driving circuit. Because the three phases have the same construction, only the U-phase is described in detail in the following. A series circuit of four semiconductor switching devices Su1, Su2, Sx1, and Sx2 is connected between a positive terminal P and a negative terminal N of a DC power supply consisting of DC single power supplies DP1, DP2, DN1, and DN2. A series circuit of flying capacitors Cu1 and Cu2 is connected between the connection point between the semiconductor switching devices Su1 and Su2 and the connection point between the semiconductor switching devices Sx1 and Sx2. When the voltage of the DC power supply is 4Ed, three levels of potential 2Ed, 0, −2Ed can be delivered at the AC output point A with the capacitor voltage controlled at 2×Ed, in which the reference voltage zero is the M point potential that is a middle potential of the DC voltage. Thus, the circuit of FIG. 1 is a three-level inverter. When a regenerative power flows from the load through the AC output point to the DC power supply, the circuit of FIG. 1 operates as a converter to convert an AC power to a DC power. Power supply from the M point potential at the middle potential point of the DC power supply to each gate driving circuit is performed with a series connection of a circuit using a high frequency transformer Tr2 and a circuit using a high frequency transformer Tr3.

The output of the circuit using a high frequency transformer Tr3 is supplied to a gate driving circuit for an IGBT, which is a semiconductor switching device. The series-connection point between the circuit using the transformer Tr2 and the circuit using the transformer Tr3 is connected to a fixed potential point of a potential point E1, which is higher than the M point potential of the DC power supply by a voltage Ed, a fixed potential point of a potential point E2, which is lower than the M point potential of the DC power supply by a voltage Ed, or a middle potential point E3 of a series circuit of the flying capacitors Cu1 and Cu2.

Figures 2, 3:
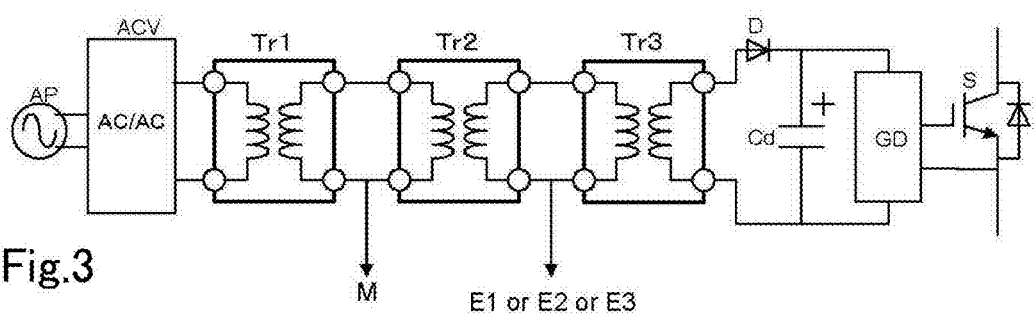
FIG. 2 is a table showing voltages at some points in the circuit of the Embodiment Example 1.
FIG. 3 is a simplified circuit diagram of the Embodiment Example 1.

FIG. 2, which is a table, shows some voltages in the power supply circuit for the gate driving circuit in the three-level output type conversion circuit shown in FIG. 1 with the potential at the middle point M of the DC power supply being defined to be zero. The voltages in FIG. 2 includes a voltage between the primary winding and the secondary winding of the high frequency transformer Tr2, a voltage between the primary winding and the secondary winding of the high frequency transformer Tr3, and a voltage at the middle point of the series-connection of the circuit using the high frequency transformer Tr2 and the circuit using the high frequency transformer Tr3. As clearly shown in the table, all the group of high frequency transformers Tr2 and the group of high frequency transformers Tr3 are subjected to an equal voltage Ed between the primary winding and the secondary winding of the transformer. Therefore, all the transformers are sufficient to withstand the voltage Ed.

Figure 12:
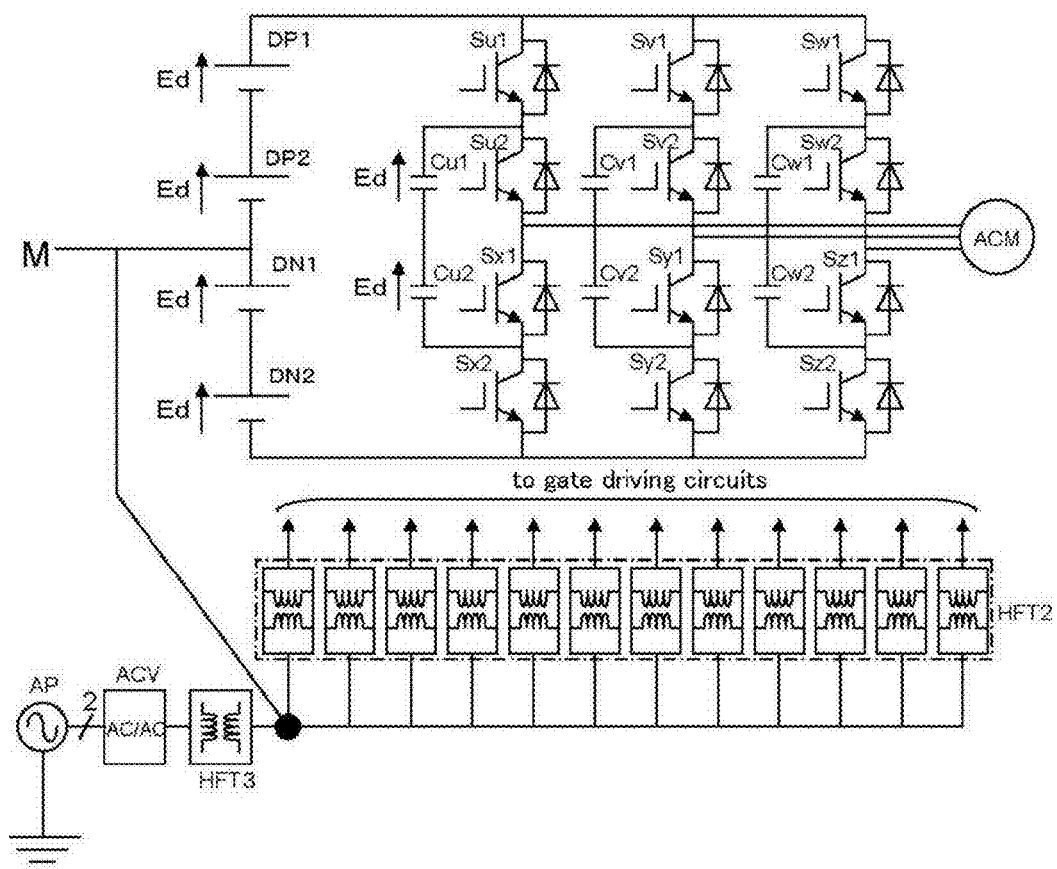
FIG. 12 is a circuit diagram of a second example of a conventional power supply circuit for gate driving circuit in a high voltage inverter system.

FIG. 3 shows a simplified construction of a circuit to produce a power for a gate driving circuit from a low voltage AC power supply AP. In the circuit of FIG. 3, the AC/AC conversion circuit ACV that converts a commercial frequency voltage of the low voltage AC power supply AP into a high frequency AC voltage is the same circuit as the one in FIG. 12; and the high frequency transformer Tr1 that electrically insulates the potential at the point M of the DC power supply from the low voltage AC power supply AP is also same as the one in FIG. 12. However, the high frequency transformers HFT2 with a high withstand voltage of at least 2 Ed in the circuit of FIG. 12 are replaced in the circuit of the embodiment of FIG. 3 by the high frequency transformers Tr2 and Tr3 with a low withstand voltage of Ed. The circuit of FIG. 3 shows a circuit having the windings of the insulating transformers directly connected in series. However, the circuit using the insulating high frequency transformer Tr1, Tr2, or Tr3 can be constructed with a combination of an AC/DC conversion circuit, a DC/AC conversion circuit, and an insulating transformer. Such a circuit can be applied effectively in the case that has a structure requiring a long wiring distance, or in the case that changes the operating frequency.

Embodiment Example 2

Figure 4:
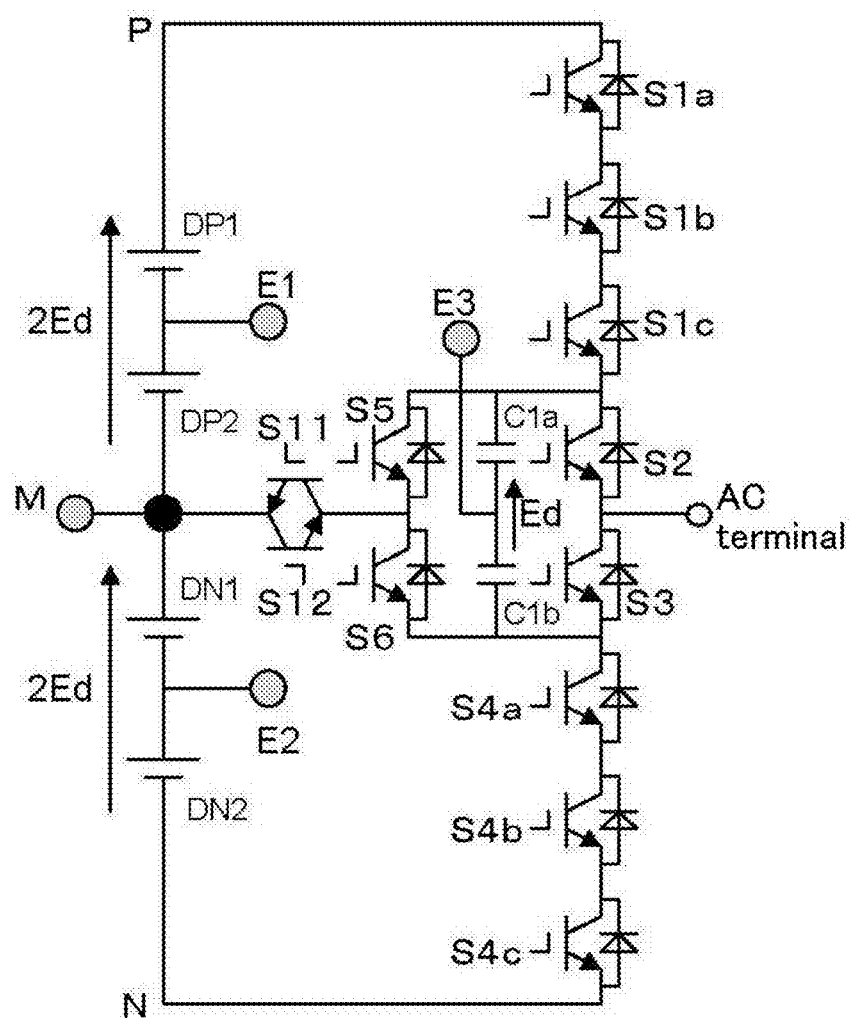
FIG. 4 is a circuit diagram of a power conversion circuit to which Embodiment Example 2 of the present invention is to be applied.

FIG. 4 shows a power conversion circuit to which Embodiment Example 2 of the present invention is to be applied. The circuit is a flying capacitor type power conversion circuit that can deliver five levels of output voltages. The following describes about only one phase in detail, because the other phases have the same construction. Because a five-level power conversion circuit is disclosed in Japanese Unexamined Patent Application Publication No. 2012-182974, for example, a detailed description is omitted here. The circuit construction for Embodiment Example 2 shown in FIG. 4 differs from the circuit construction of Embodiment Example 1 shown in FIG. 1 in that the circuit of FIG. 4 includes a series circuit of semiconductor switching devices S5 and S6 connected in parallel to the series circuit of the flying capacitors C1a and C1b, and includes a bidirectional switch having antiparallel-connected reverse-blocking IGBTs S11 and S12 between the series connection point between the series-connected semiconductor switching devices S5 and S6 and the middle point M of the DC power supply.

The DC power supply includes DC single power supplies DP1, DP2, DN1, and DN 2 connected in series, where the potential at the middle point M is zero and the voltage of each single power supply is Ed. When the voltage of the series circuit of the flying capacitors C1a and C1b is controlled at a voltage Ed, five levels of voltage can be delivered from the AC terminal. Like in Embodiment Example 1, the potential at the series connection point between the high frequency transformer Tr2 and the high frequency transformer Tr3 as shown in FIG. 3 is connected, corresponding to the operation potential of the gate driving circuit for the IGBTs, to a fixed potential point of the connection point E1 between the DC single power supplies DP1 and DP2, the connection point E2 between the DC single power supplies DN1 and DN2, or the series connection point of the flying capacitors C1a and C1b. Thus, voltage division can be performed in the power supply circuit for the gate driving circuit for the semiconductor switching devices.

FIG. 5, which is a table, shows some voltages, with the potential at the middle point M of the DC power supply being defined to be zero, including a voltage between the primary winding and the secondary winding of the high frequency transformer Tr2, a voltage between the primary winding and the secondary winding of the high frequency transformer Tr3, and a voltage at the middle point between the series-connection point of the high frequency transformer Tr2 and the high frequency transformer Tr3. This circuit needs three types of transformers with a withstand voltage of 1.5 Ed, and with a withstand voltage of Ed, and with a withstand voltage of 0.5 Ed. As compared with the conventional circuit in which all the power supply circuit for gate driving circuit needs transformers with a withstand voltage of 2 Ed, downsizing and cost reduction are achieved.

Embodiment Example 3

Figure 6:
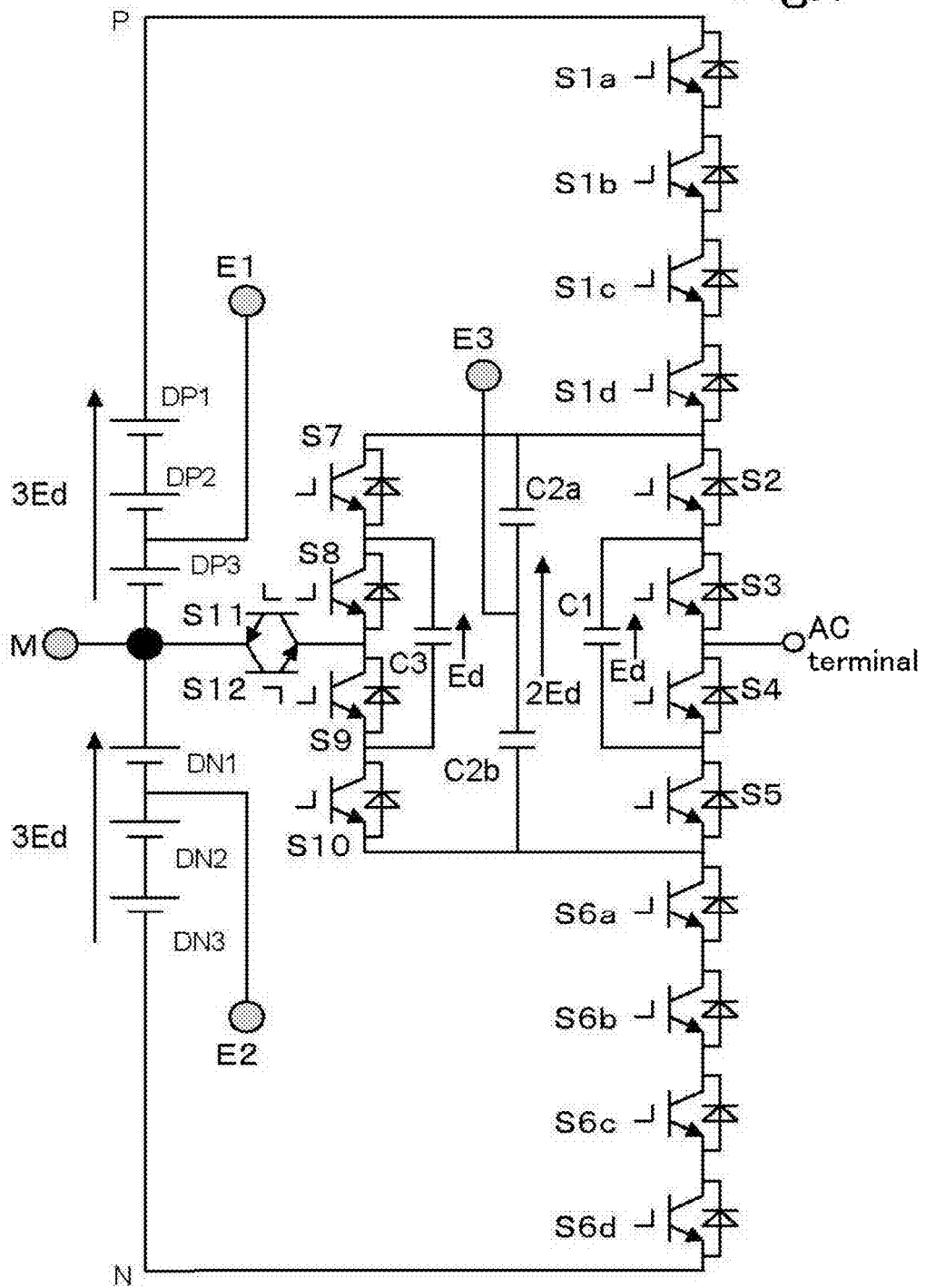
FIG. 6 is a circuit diagram of a power conversion circuit to which Embodiment Example 3 of the present invention is to be applied.
Figure 8:
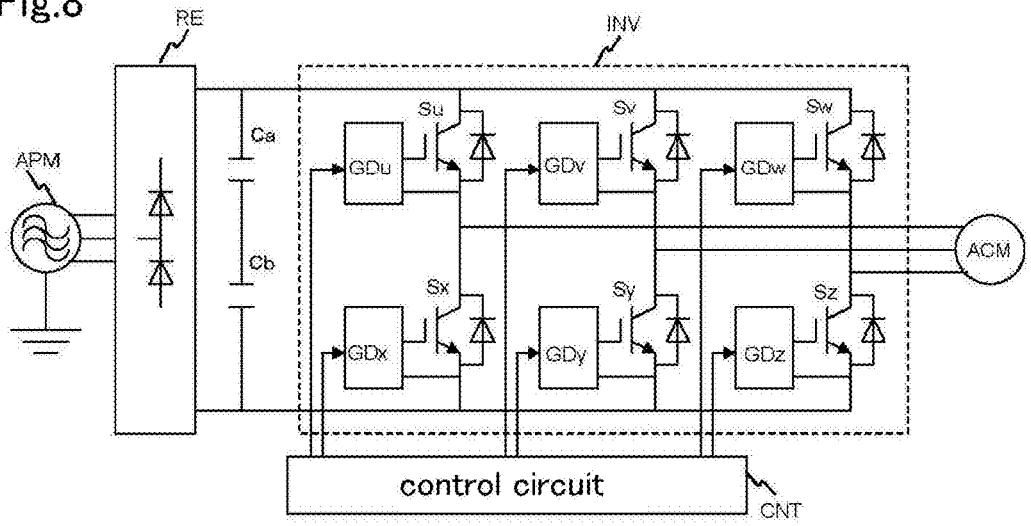
FIG. 8 shows a general circuit construction of a three-phase inverter system.
Figure 9A:
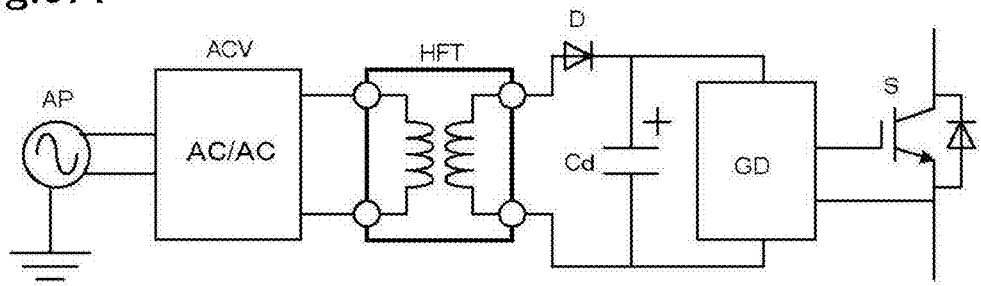
Figure 9B:
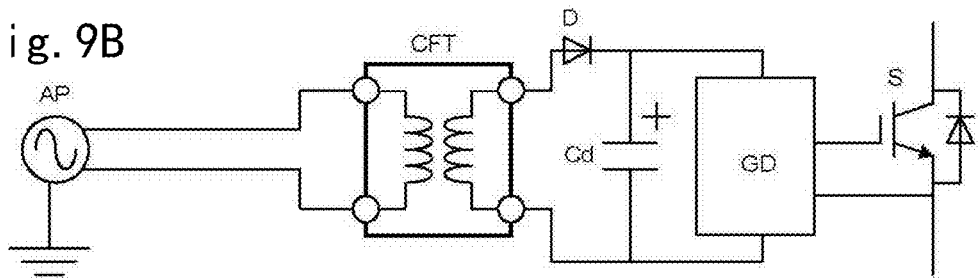
Figure 10:
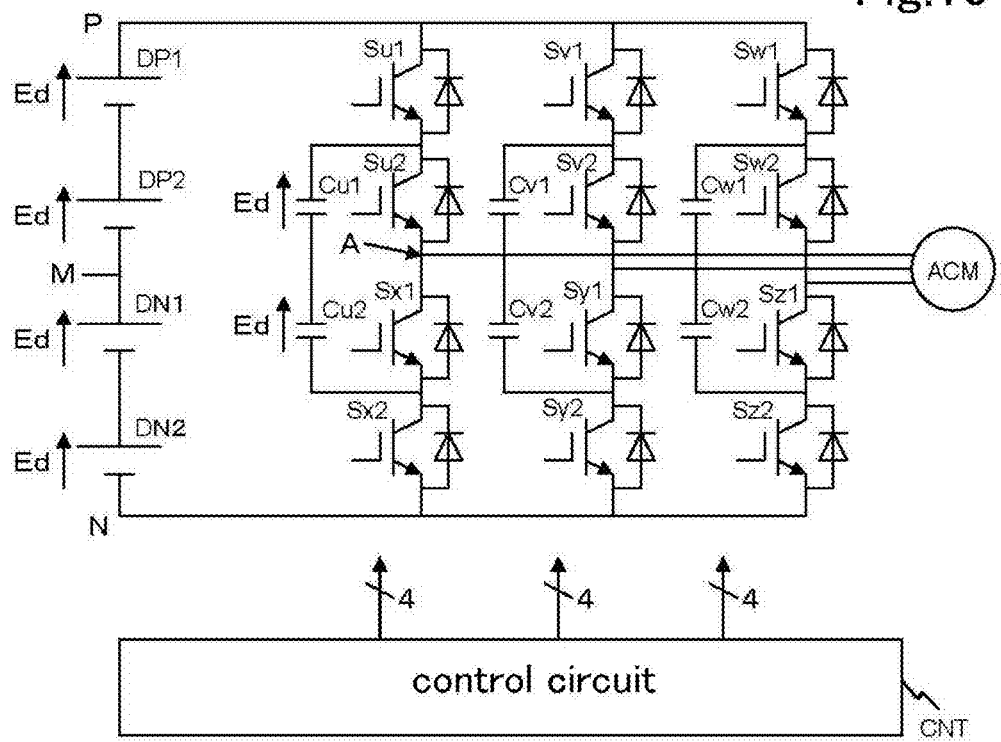
FIG. 10 is a circuit diagram of a main circuit of a conventional three-level high voltage inverter system.
Figure 11:
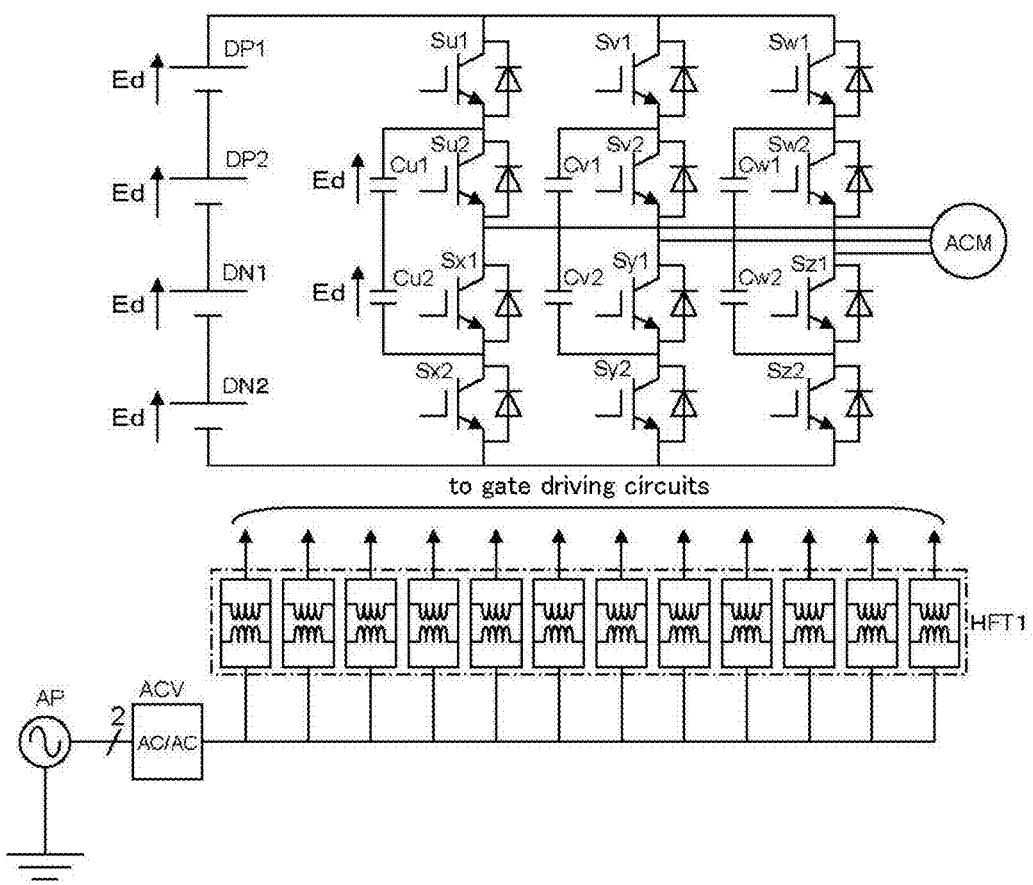
FIG. 11 is a circuit diagram of a first example of a conventional power supply circuit for gate driving circuit in a high voltage inverter system.

FIG. 6 shows a power conversion circuit to which Embodiment Example 3 of the present invention is to be applied. The circuit is a flying capacitor type power conversion circuit that can deliver seven-levels of output voltages. The following describes about only one phase. A seven-level power conversion circuit was invented by the inventor of the present invention and has been disclosed in Japanese Unexamined Patent Application Publication No. 2013-146117. Therefore, detailed description is omitted here. The main circuit of the circuit of FIG. 6 has a construction expanded from the circuit structure of Embodiment Example 2 of FIG. 4 to perform seven-level operation. The main circuit includes a series circuit of semiconductor switching devices S1a through S1d, S2 through S5, and S6a through S6d, the series circuit being connected in parallel with a DC power supply consisting of DC single power supplies of DP1, DP2, DP3, DN1, DN2, and DN3.

The circuit of FIG. 6 further includes: a first flying capacitor C1 connected in parallel with a series circuit of the semiconductor switching devices S3 and S4; a second flying capacitor of a series circuit of flying capacitors C2a and C2b; a series circuit of semiconductor switching devices S7 through S10 connected in parallel with the series circuit of the capacitors C2a and C2b; a third flying capacitor of C3 connected in parallel with a series circuit of the semiconductor switching devices S8 and S9; and a bidirectional switch composed of antiparallel-connected reverse-blocking IGBTs S11 and S12 between the connection point of the series-connected semiconductor switching devices S8 and S9 and the middle point M of the DC power supply.

The DC power supply includes DC single power supplies DP1, DP2, DP3, DN1, DN 2, and DN3 connected in series, and the potential at the middle point M is zero and the voltage of each single power supply is Ed. When the voltages of the flying capacitors C1 and C3 are each controlled at Ed, and the voltage of the series circuit of the flying capacitors C2a and C2b is controlled at a voltage of 2 Ed, seven levels of voltage can be delivered from the AC terminal. Like in Embodiment Example 1 and Embodiment Example 2, the potential at the series connection point between the high frequency transformer Tr2 and the high frequency transformer Tr3 as shown in FIG. 3 is connected, corresponding to the operation potential of the gate driving circuit for the IGBTs, to a fixed potential point of the connection point E1 between the DC single power supplies DP2 and DP3, the connection point E2 between the DC single power supplies DN1 and DN2, or the series connection point E3 of the flying capacitors C2a and C2b. Thus, voltage division can be performed in the power supply circuit for the driving circuit for the semiconductor switching devices.

FIG. 7, which is a table, shows some voltages, with the potential at the middle point M of the DC power supply being defined to be zero, including a voltage between the primary winding and the secondary winding of the high frequency transformer Tr2, a voltage between the primary winding and the secondary winding of the high frequency transformer Tr3, and a voltage at the middle point between the series-connected high frequency transformer Tr2 and the high frequency transformer Tr3. This circuit needs two types of transformers with a withstand voltage of 2 Ed, and with a withstand voltage of Ed. As compared with the conventional circuit in which all the power supply circuit for gate driving circuit needs transformers with a withstand voltage of 3 Ed, downsizing and cost reduction are achieved.

The description thus far is conducted about the embodiments for flying capacitor type power conversion circuits of three-levels, five-levels, and seven-levels of output voltage. However, the present invention can be applied to more levels of multilevel power conversion circuits. Fixed potential point of the DC power supply to be connected to the series connection point between the high frequency transformer Tr2 and the high frequency transformer Tr3 can be the series connection point between the DC single power supplies DP1 and DP2, or the series connection point of the DC single power supplies DN2 and DN3, achieving the same effects. The number of series connection of the circuits each using a transformer can be three or more and each of the series connection point is connected to a middle potential point between flying capacitors or a fixed potential point of the DC power supply, achieving the same effects.

The present invention can be applied to high voltage motor driving equipment, a power conversion equipment for system interconnection, and other power conversion systems that use a flying capacitor type power conversion circuit having a three terminal input DC power supply composed of two or more DC single power supplies and delivering multi-levels of voltages.

What is claimed is:

1. A power supply circuit for a gate driving circuit for driving semiconductor switching devices of a power converter that is configured to perform a DC to AC conversion, the power supply circuit comprising:
   a DC power supply including a plurality of serially-connected single DC power supplies;
   a flying capacitor type power conversion circuit including a plurality of flying capacitors connected in parallel to a plurality of the semiconductor switching devices; and
   a plurality of serially-connected circuits each including a pair of serially-connected transformers, a middle part of each pair of serially-connected transformers, where the two transformers of said each pair are connected to each other, being connected to a middle potential point of the flying capacitors, and to a fixed potential point of the DC power supply.

2. The power supply circuit according to claim 1, wherein
   the DC power supply has a highest potential point, a lowest potential point and a middle potential point, and
   the fixed potential point of the DC power supply is at least one of a potential point between the highest potential point and the middle potential point, and a potential point between the lowest potential point and the middle potential point.

3. The power supply circuit according to claim 2, wherein the pair of serially-connected transformers is connected to a reference potential point that is the middle potential point of the DC power supply.

4. The power supply circuit according to claim 1, wherein the pair of serially-connected transformers is connected to a reference potential point that is the middle potential point of the DC power supply.

5. The power supply circuit according to claim 1, wherein the flying capacitor type power conversion circuit further includes
   a plurality of serially-connected semiconductor switching devices connected in parallel to the plurality of the flying capacitors, and
   a bidirectional switch having two antiparallel-connected reverse-blocking semiconductor switching devices, the bidirectional switch being connected between a middle point of the plurality of serially-connected semiconductor switching devices and a middle potential point of the DC power supply.

6. The power supply circuit according to claim 5, wherein the flying capacitor type power conversion circuit further includes another flying capacitor connected in parallel to a subset of the plurality of serially-connected semiconductor switching devices that are connected in parallel to the plurality of the flying capacitors.

7. The power supply circuit according to claim 1, wherein each transformer of the pair of serially-connected transformers is a high frequency transformer.

8. The power supply circuit according to claim 1, further comprising a plurality of parallelly-connected flying capacitor type power conversion circuits, the plurality of flying capacitor type power conversion circuits being connected in parallel to the flying capacitor type power conversion circuit, and each having a same configuration as that of the flying capacitor type power conversion circuit.

* * * * *